US009656853B2

United States Patent
Chen et al.

(10) Patent No.: US 9,656,853 B2
(45) Date of Patent: May 23, 2017

(54) MEMS CHIP PACKAGE

(71) Applicant: Merry Electronics(Shenzhen) Co., Ltd., Guangdong (CN)

(72) Inventors: Jen-Yi Chen, Taichung (TW);
Chao-Sen Chang, Taichung (TW);
Chun-Chieh Wang, Taichung (TW);
Yung-Shiang Chang, Taichung (TW)

(73) Assignee: Merry Electronics(Shenzhen) Co., Ltd., Guangdong (CN)

( * ) Notice: Subject to any disclaimer, the term of this patent is extended or adjusted under 35 U.S.C. 154(b) by 0 days.

(21) Appl. No.: 14/940,167

(22) Filed: Nov. 13, 2015

(65) Prior Publication Data
US 2016/0368760 A1    Dec. 22, 2016

(30) Foreign Application Priority Data

Jun. 22, 2015   (TW) .............................. 104119967 A

(51) Int. Cl.
*B81B 3/00*   (2006.01)
(52) U.S. Cl.
CPC ........ *B81B 3/0027* (2013.01); *B81B 2203/04* (2013.01); *B81B 2207/015* (2013.01)
(58) Field of Classification Search
CPC ............ B81B 3/0027; B81B 2207/015; B81B 2203/04
See application file for complete search history.

(56) References Cited

U.S. PATENT DOCUMENTS

| 2012/0087521 | A1  | 4/2012  | Delaus et al. | |
|---|---|---|---|---|
| 2013/0193533 | A1* | 8/2013  | Vos | H04R 19/005 257/416 |
| 2013/0322662 | A1* | 12/2013 | Chen | H04R 19/005 381/174 |
| 2014/0064546 | A1  | 3/2014  | Szczech et al. | |
| 2014/0254851 | A1* | 9/2014  | Chen | H04R 1/04 381/355 |

(Continued)

FOREIGN PATENT DOCUMENTS

| CN | 203788459 | 8/2014 |
|---|---|---|
| TW | I401774 | 7/2013 |

*Primary Examiner* — Steven Loke
*Assistant Examiner* — Juanita Rhodes
(74) *Attorney, Agent, or Firm* — Jianq Chyun IP Office

(57) ABSTRACT

A micro-electro-mechanical system (MEMS) chip package including a circuit substrate, a driving chip and a MEMS sensor is provided. The circuit substrate has a first surface and a second surface opposite thereto. The driving chip is embedded within the circuit substrate and includes a first signal transmission electrode, a second signal transmission electrode and a third signal transmission electrode. The MEMS sensor is disposed on the first surface of the circuit substrate. The circuit substrate includes at least one first conductive wiring electrically connected with the first signal transmission electrode and at least one second conductive wiring electrically connected with the second signal transmission electrode. The first conductive wiring is merely exposed at the first surface and the second conductive wiring is merely exposed at the second surface. The MEMS sensor is electrically connected with the first signal transmission electrode through the first conductive wiring.

11 Claims, 3 Drawing Sheets

(56) References Cited

U.S. PATENT DOCUMENTS

2014/0306299 A1\* 10/2014 Kasai .................... B81B 3/0027
257/416
2015/0001646 A1\* 1/2015 Mueller ................. H04R 31/00
257/416

\* cited by examiner

MEMS CHIP PACKAGE

CROSS-REFERENCE TO RELATED APPLICATION

This application claims the priority benefit of Taiwan application serial no. 104119967, filed on Jun. 22, 2015. The entirety of the above-mentioned patent application is hereby incorporated by reference herein and made a part of this specification.

BACKGROUND OF THE INVENTION

1. Field of the Invention

The invention generally relates to a chip package, and more particularly, to a micro-electro-mechanical system (MEMS) sensor package.

2. Description of Related Art

As technology advances, electronic products all develop towards the trends of lightweight and miniaturization. Taking microphones as an example, MEMS sensors have been widely applied in such field. Traditional microphone includes a MEMS sensor, a driving chip for driving the MEMS sensor and a circuit board for carrying the MEMS sensor and the driving chip. The circuit board, in addition to having a conductive layer and a dielectric layer, further has some conductive through vias, and the driving chip within the microphone is usually electrically connected with the conductive through vias. During a packaging process of the MEMS sensor, when static electricity accumulates to a certain level and results in a discharging phenomenon, because the driving chip is electrically connected with the conductive through vias, the driving chip is liable to be damaged due to an influence of electrostatic discharge, and thereby leads to a reduction in packaging yield.

Therefore, how to effectively increase the packaging yield of the MEMS sensors without significantly altering the packaging process is currently one of the important problems desired to be solved by researchers.

SUMMARY OF THE INVENTION

The invention provides a micro-electro-mechanical system (MEMS) chip package, which is less susceptible to be influenced by static electricity.

The MEMS chip package of the invention includes a circuit substrate, a driving chip and a MEMS sensor. The circuit substrate has a first surface and a second surface opposite to the first surface. The driving chip is embedded within the circuit substrate, and the driving chip includes at least one first signal transmission electrode, at least one second signal transmission electrode and at least one third signal transmission electrode. The MEMS sensor is disposed on the first surface of the circuit substrate. The circuit substrate includes at least one first conductive wiring electrically connected with the first signal transmission electrode and at least one second conductive wiring electrically connected with the second signal transmission electrode, the first conductive wiring is merely exposed at the first surface, and the second conductive wiring is merely exposed at the second surface. The MEMS sensor is electrically connected with the first signal transmission electrode through the first conductive wiring.

In one embodiment of the invention, the circuit substrate may further include at least one third conductive wiring simultaneously exposed at the first surface and the second surface, and the third conductive wiring and the driving chip are electrically independent.

In one embodiment of the invention, the circuit substrate has a sound port, the MEMS sensor has a cavity, and the sound port is corresponded to the cavity.

In one embodiment of the invention, the driving chip is embedded within the circuit substrate, and the driving chip keeps a distance with the sound port.

In one embodiment of the invention, the driving chip is, for example, an application specific integrated circuit (ASIC).

In one embodiment of the invention, the MEMS sensor is, for example, an acoustic detector.

In one embodiment of the invention, the first signal transmission electrode, the second signal transmission electrode and the third signal transmission electrode are distributed on a same surface of the driving chip.

In one embodiment of the invention, the first signal transmission electrode is a signal input electrode, the second signal transmission electrode is a signal output electrode, and the third signal transmission electrode is a grounding electrode.

In one embodiment of the invention, the third signal transmission electrode is electrically connected onto the second surface of the circuit substrate.

In one embodiment of the invention, the MEMS chip package may further include a plurality of conductive bumps, wherein the MEMS sensor is electrically connected with the circuit substrate through the conductive bumps by flip-chip bonding.

In one embodiment of the invention, the MEMS chip package may further include a plurality of bonding wires, wherein the MEMS sensor is electrically connected with the circuit substrate through the bonding wires.

In one embodiment of the invention, the MEMS chip package may further includes an electronic component, the electronic component is disposed on the first surface, and the electronic component is electrically connected with the driving chip through the circuit substrate.

In one embodiment of the invention, the MEMS chip package may further include a cover lid, the cover lid is disposed on the first surface, and the cover lid covers the MEMS sensor. In other embodiment, the cover lid may be a conductive cover lid, and the conductive cover lid is electrically connected with the driving chip through the circuit substrate.

In one embodiment of the invention, the circuit substrate may further include at least one third conductive wiring simultaneously exposed at the first surface and the second surface, and the third conductive wiring is electrically connected with the conductive cover lid.

In view of the above, in the MEMS chip package of the invention, since the first conductive wiring electrically connected with the driving chip is merely exposed at the first surface and the second conductive wiring electrically connected with the driving chip is merely exposed at the second surface, the MEMS chip package of the invention is less susceptible to be influenced by static electricity, and thus have a higher packaging yield.

In order to make the aforementioned features and advantages of the present invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

First Embodiment

Figure 1A:
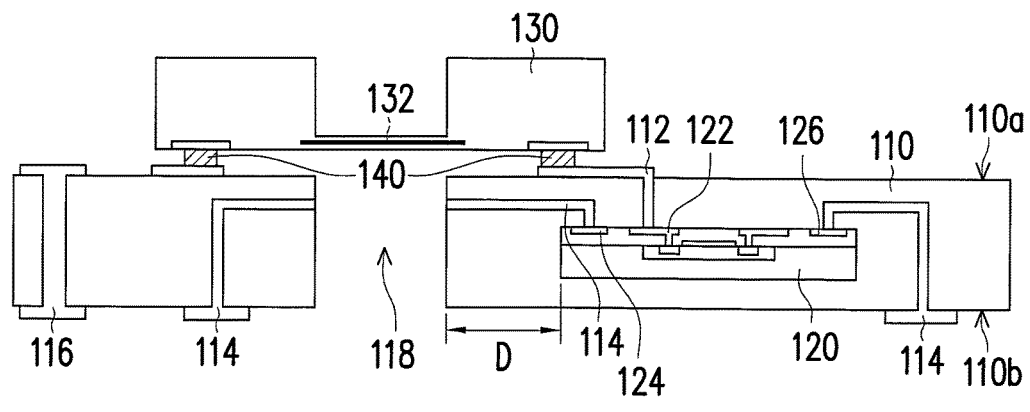
FIG. 1A and FIG. 1B are schematic diagrams respectively illustrating a MEMS chip package according to a first embodiment of the invention.
Figure 1B:
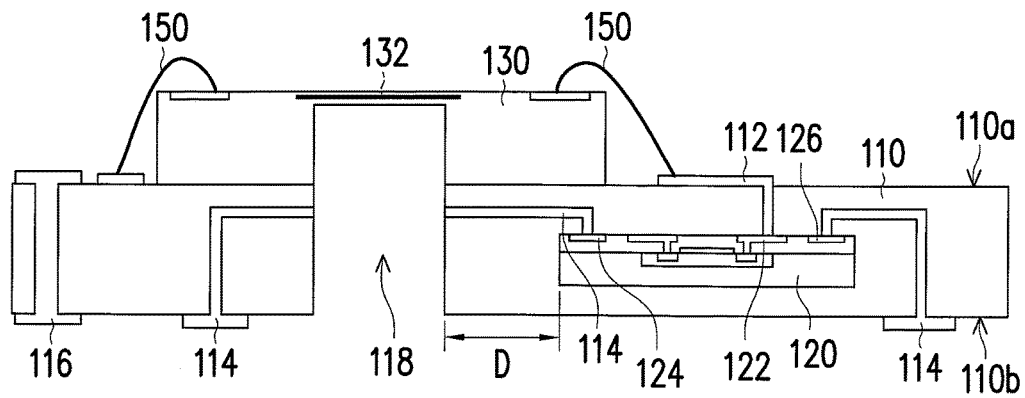

FIG. 1A and FIG. 1B are schematic diagrams respectively illustrating a micro-electro-mechanical system (MEMS) chip package according to the first embodiment of the invention. Referring to both FIG. 1A and FIG. 1B, the micro-electro-mechanical system chip package 100a of the present embodiment includes a circuit substrate 110, a driving chip 120 and a MEMS sensor 130. The circuit substrate 110 has a first surface 110a and a second surface 110b opposite to the first surface 110a. The driving chip 120 is embedded within the circuit substrate 110, and the driving chip 120 includes at least one first signal transmission electrode 122, at least one second signal transmission electrode 124 and at least one third signal transmission electrode 126. The MEMS sensor 130 is disposed on the first surface 110a of the circuit substrate 110. In the present embodiment, the circuit substrate is, for example, a printed circuit board having multiple patterned conductive wiring layers, the driving chip 120 is, for example, an application specific integrated circuit (ASIC), and the MEMS sensor 130 is, for example, an acoustic detector. The driving chip 120 is entirely embedded within the circuit substrate 110; specifically, the driving chip 120 is wrapped by the circuit substrate 110 and is not exposed to the outside. The circuit substrate 110 of the present embodiment includes at least one first conductive wiring 112 electrically connected with the first signal transmission electrode 122 of the driving chip 120 and at least one second conductive wiring 114 with the electrically connected of the second signal transmission electrode 124 of the driving chip 120, wherein the first conductive wiring 112 is merely exposed at the first surface 110a, and the second conductive wiring 114 is merely exposed at the second surface 110b. The MEMS sensor 130 is electrically connected with the first signal transmission electrode 122 of the driving chip 120 through the first conductive wiring 112 exposed at the first surface 110a.

In the present embodiment, the first signal transmission electrode 122, the second signal transmission electrode 124 and the third signal transmission electrode 126 are distributed on a same surface of the driving chip 120; and generally, the surface of the driving chip 120 that has the first signal transmission electrode 122, the second signal transmission electrode 124 and the third signal transmission electrode 126 is defined as an active surface thereof. In view of the above, the first signal transmission electrode 122 is, for example, a signal input electrode, the second signal transmission electrode 124 is, for example, a signal output electrode, the third signal transmission electrode 126 is, for example, a grounding electrode, and the third signal transmission electrode (i.e., a grounding electrode) 126 is, for example, electrically connected onto the second surface 110b of the circuit substrate 110. Accordingly, the third signal transmission electrode (i.e., the grounding electrode) 126 in the present embodiment is, for example, electrically connected with some of the second conductive wirings 114. In other words, a signal transmitted by the third signal transmission electrode (i.e., the grounding electrode) 126 may can be transmitted onto the second surface 110b of the circuit substrate 110 through some of the second conductive wirings 114, so as to achieve the purpose of grounding.

It is worth noted that, the first conductive wiring 112 of the present embodiment is merely exposed at the first surface 110a but not exposed at the second surface 110b, and the second conductive wiring 114 of the present embodiment is merely exposed at the second surface 110b, but not exposed at the first surface 110a. In other words, the first conductive wiring 112 and the second conductive wiring 114 are both not simultaneously exposed at the first surface 110a and the second surface 110b. During the process of packaging, when static electricity accumulates to a certain level and results in a discharge phenomenon, because the first conductive wiring 112 and the second conductive wiring 114 are both not simultaneously exposed at the first surface 110a and the second surface 110b, the probability of damaging the driving chip 120 due to electrostatic discharge can be significantly reduced. Those skilled in the art should be able to adjust the amounts and the forms of the first conductive wiring 112 and the second conductive wiring 114 according to practical design requirements, such that the present embodiment does not intend to limit the amounts and the forms of the first conductive wiring 112 and the second conductive wiring 114.

As shown in FIG. 1A and FIG. 1B, in addition to the first conductive wiring 112 and the second conductive wiring 114, the circuit substrate 110 of the present embodiment may further include at least one third conductive wiring 116 simultaneously exposed at the first surface 110a and the second surface 110b, and the third conductive wiring 116 and the driving chip 120 are electrically independent. Those skilled in the art should be able to adjust the amount and the form of the third conductive wiring 116 according to the practical design requirements, such that the present embodiment does not intend to limit the amount and the form of the third conductive wiring 116.

In order for the MEMS sensor 130 to sense the sound coming from the side where the circuit substrate 110 locates, the circuit substrate 110 of the present embodiment may selectively have a sound port 118, the MEMS sensor 130 has a cavity 132, and the sound port 118 is corresponded to the cavity 132. In detail, in the present embodiment, the cavity 132 of the MEMS sensor 130 includes a back plate and a diaphragm, wherein the back plate keeps a gap with the diaphragm. The MEMS sensor 130 may convert sound vibration energy into an electrical signal, and the electrical signal generated from the MEMS sensor 130 can be read by the first conductive wiring 112, the driving chip 120 and the circuit substrate 110.

Because the driving chip 120 is entirely embedded within the circuit substrate 110, the driving chip 120 keeps a specific distance D with the sound port 118 of the circuit substrate 110, and this distance D can ensure that the driving chip 120 will not be exposed outside of the circuit substrate 110, so the driving chip 120 can be properly protected.

As shown in FIG. 1A, the MEMS chip package 100a of the present embodiment may further include a plurality of conductive bumps 140, wherein the conductive bumps 140 are located between the MEMS sensor 130 and the circuit substrate 110, and the MEMS sensor 130 is electrically connected with the circuit substrate 110 and the driving chip 120 through the conductive bumps 140 by flip-chip bonding. In detail, the MEMS sensor 130, for example, has a plurality of bonding pads, and a portion of the bonding pads can be electrically connected with the driving chip 120 within the circuit substrate 110 through a portion of the conductive bumps 140 and the first conductive wiring 112, while another portion of the bonding pads can be electrically connected with the circuit substrate 110 through another portion of the conductive bumps 140. For instance, the conductive bumps 140 may be solder bumps, gold bumps, polymer conductive bumps and so forth, but the invention is not limited thereto.

As shown in FIG. 1B, the MEMS chip package 100b of the present embodiment may further include a plurality of bonding wires 150, and the MEMS sensor 130 is electrically connected with the circuit substrate 110 through the bonding wires 150. In detail, the MEMS sensor 130, for example, has a plurality of bonding pads, and a portion of the bonding pads can be can be electrically connected with the driving chip 120 within the circuit substrate 110 through a portion of the bonding wires 150 and the first conductive wiring 112, while another portion of the bonding pads can be electrically connected with the circuit substrate 110 through another portion of the bonding wires 150. For instance, the bonding wires 150 may be gold wires and so forth, but the invention is not limited thereto.

Second Embodiment

Figure 2A:
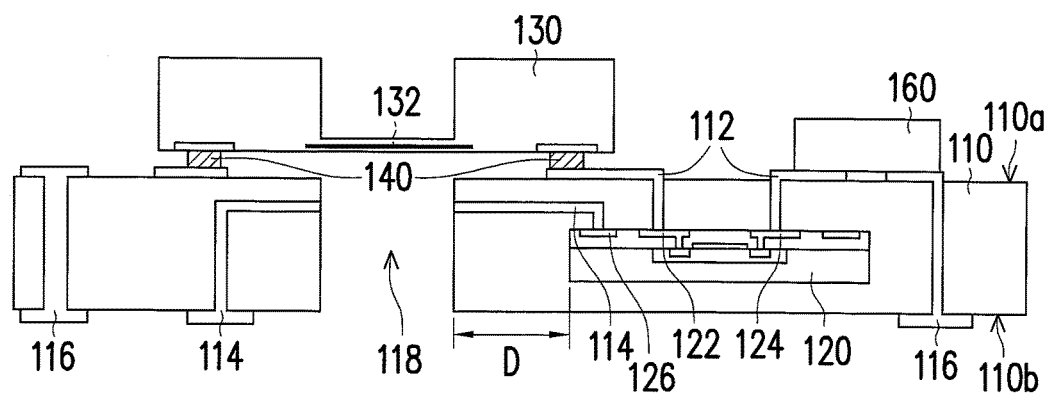
FIG. 2A and FIG. 2B are schematic diagrams respectively illustrating a MEMS chip package according to a second embodiment of the invention.
Figure 2B:
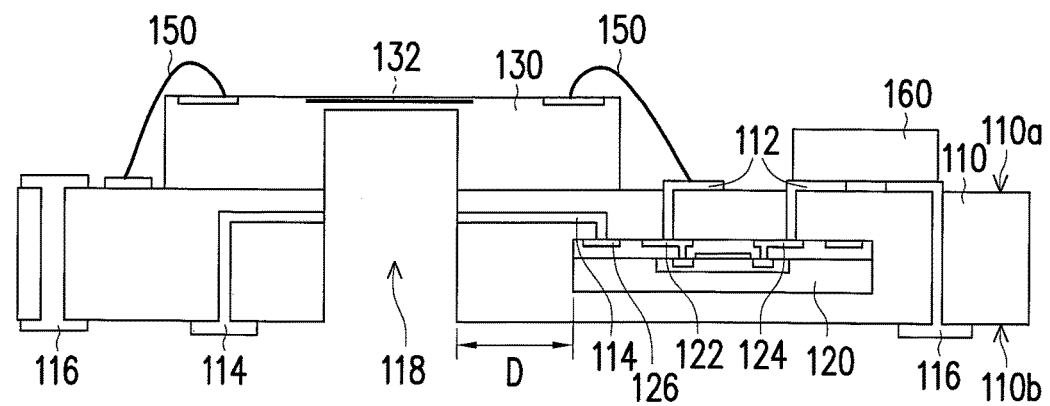

FIG. 2A and FIG. 2B are schematic diagrams respectively illustrating a MEMS chip package according to the second embodiment of the invention. Referring to FIG. 2A and FIG. 2B, the MEMS chip packages 100c and 100d of the present embodiment are similar to the MEMS chip packages 100a and 100b of the first embodiment, except that a main difference between the two embodiments lies in: the MEMS chip packages 100c and 100d each further include an electronic component 160, wherein the electronic component 160 is disposed on the first surface 110a of the circuit substrate 100, and the electronic component 160 is electrically connected with the driving chip 120 through the circuit substrate 110. In the present embodiment, the electronic component 160 is, for example, a passive component such as a resistor, a capacitor, an inductor and so forth, but the invention is not limited thereto.

As shown in FIG. 2A and FIG. 2B, the electronic component 160 is, for example, electrically connected with the second signal transmission electrode (i.e., the signal output electrode) 124 of the driving chip 120 through the first conductive wiring 112 located on the first surface 110a. In addition, the electronic component 160 is also electrically connected with the third conductive wiring 116 of the circuit substrate 110, so a signal outputted by the second signal transmission electrode 124 of the driving chip 120 can be transmitted onto the second surface 110b of the circuit substrate 110 through the first conductive wirings 112, the electronic component 160 and the third conductive wiring 116.

Third Embodiment

Figure 3A:
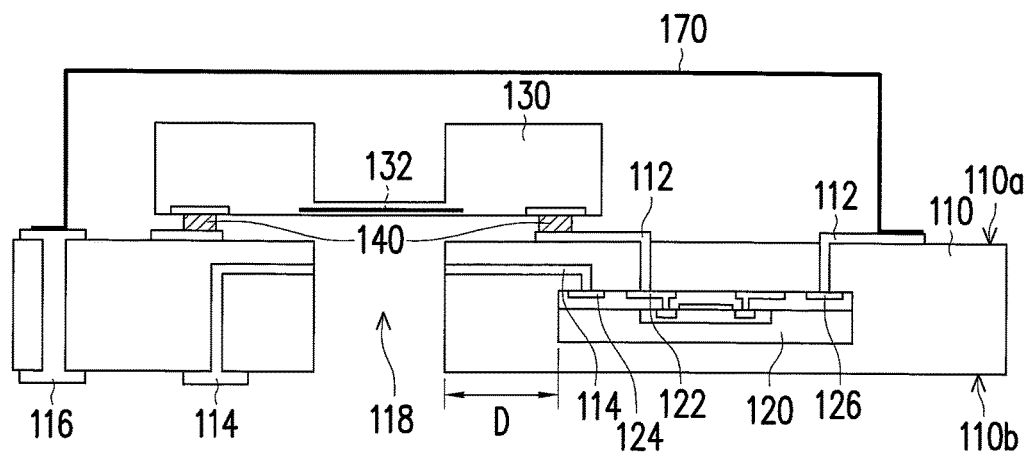
FIG. 3A and FIG. 3B are schematic diagrams respectively illustrating a MEMS chip package according to a third embodiment of the invention.
Figure 3B:
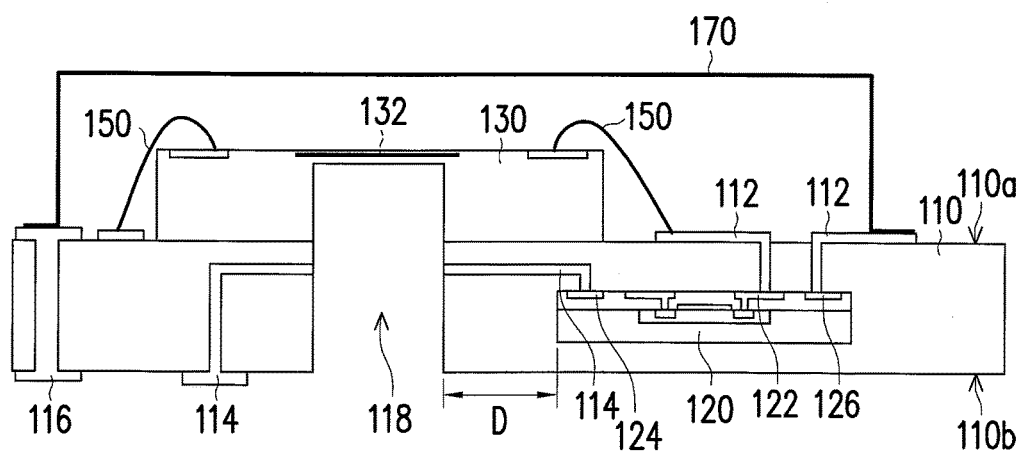

FIG. 3A and FIG. 3B are schematic diagrams respectively illustrating a MEMS chip package according to the third embodiment of the invention. Referring to both FIG. 3A and FIG. 3B, the MEMS chip packages 100e and 100f of the present embodiment are similar to the MEMS chip package 100a and 100b of the first embodiment, except that a main difference between the two embodiments lies in: the MEMS chip packages 100e and 100f each further includes a cover lid 170, wherein the cover lid 170 is disposed on the first surface 110a of the circuit substrate 100 and covers the MEMS sensor 130.

For instance, the cover lid 170 may be a conductive cover lid, and this conductive cover lid is electrically connected with the driving chip 120 through the circuit substrate 110, so as to shield noises. In other possible embodiments, the conductive cover lid 170 may be electrically connected with the grounding circuit (e.g., the third conductive wiring 116) within the circuit substrate 110, so as to shield noises. In addition, the conductive cover lid 170 may also selectively be electrically connected with a signal circuit of the circuit substrate 110, so as to transmit signal. It is worth noted that, in the present embodiment, the third signal transmission electrode (i.e., the grounding electrode) 126 of the driving chip 120 is, for example, connected with the conductive cover lid 170 through some of the first conductive wirings 112, and the conductive cover lid 170 is then connected with the third conductive wiring 116. In other words, the third signal transmission electrode 126 can achieve the purpose of grounding through some of the first conductive wirings 112, the conductive cover lid 170 and the third conductive wiring 116. In other words, the third signal transmission electrode (i.e., the grounding electrode) 126 of the driving chip 120 is grounded through the conductive cover lid 170.

In other possible embodiments (not shown), the third signal transmission electrode (i.e., the grounding electrode) 126 of the driving chip 120 may also be electrically connected onto the second surface 110b of the circuit substrate 110 directly through the second conductive wiring 114 that is merely exposed at the second surface 100b, so as to achieve the purpose of grounding. In addition, the conductive cover lid 170 of the present embodiment is, for example, electrically connected onto the second surface 110b of the circuit substrate 110 through the third conductive wiring 116 in the circuit substrate 110, so as to achieve the purpose of grounding. In other words, the third signal transmission electrode (i.e., the grounding electrode) 126 of the driving chip 120 and the conductive cover lid 170 are respectively grounded.

In each of the embodiments (the first to the third embodiments) of the invention, because the first conductive wiring 112 electrically connected with the driving chip 120 is merely exposed at the first surface 110a and the second conductive wiring 114 electrically connected with the driving chip 120 is merely exposed at the second surface 110b, the probability of damaging each of the MEMS chip packages 100a to 100f of the invention due to electrostatic discharge is reduced, and thus the packaging yield can be increased by a certain extent.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A micro-electro-mechanical system (MEMS) chip package, comprising:
    a circuit substrate, having a first surface and a second surface opposite to the first surface;

a driving chip, embedded within the circuit substrate, the driving chip comprising at least one first signal transmission electrode, at least one second signal transmission electrode and at least one third signal transmission electrode; and a MEMS sensor, disposed on the first surface of the circuit substrate, wherein the circuit substrate comprises at least one first conductive wiring electrically connected with the first signal transmission electrode and at least one second conductive wiring electrically connected with the second signal transmission electrode, and the MEMS sensor is electrically connected with the first signal transmission electrode through the first conductive wiring, and wherein the circuit substrate further comprises at least one third conductive wiring simultaneously exposed at the first surface of the circuit substrate and the second surface of the circuit substrate, and the third conductive wiring and the driving chip are not electrically coupled to each other.

2. The MEMS chip package as recited in claim 1, wherein the circuit substrate has a sound port, the MEMS sensor has a cavity, and the sound port is corresponded to the cavity.

3. The MEMS chip package as recited in claim 2, wherein the driving chip is embedded within the circuit substrate, and the driving chip is disposed a distance with the sound port.

4. The MEMS chip package as recited in claim 1, wherein the driving chip comprises an application specific integrated circuit (ASIC).

5. The MEMS chip package as recited in claim 1, wherein the first signal transmission electrode, the second signal transmission electrode and the third signal transmission electrode are distributed on a same surface of the driving chip.

6. The MEMS chip package as recited in claim 1, wherein the first signal transmission electrode is a signal input electrode, the second signal transmission electrode is a signal output electrode, and the third signal transmission electrode is grounding electrode.

7. The MEMS chip package as recited in claim 6, wherein the third signal transmission electrode is electrically connected onto the second surface of the circuit substrate.

8. The MEMS chip package as recited in claim 1, wherein the MEMS sensor comprises an acoustic detector.

9. The MEMS chip package as recited in claim 1, further comprising:
a plurality of bonding wires, wherein the MEMS sensor is electrically connected with the circuit substrate through the plurality of bonding wires.

10. The MEMS chip package as recited in claim 1, further comprising:
a cover lid, disposed on the first surface of the circuit substrate, wherein the cover lid covers the MEMS sensor.

11. The MEMS chip package as recited in claim 1, wherein the first conductive wiring is merely exposed at the first surface of the circuit substrate, the second conductive wiring is merely exposed at the second surface of the circuit substrate.

* * * * *